United States Patent [19]

Yasui et al.

[11] Patent Number: 5,334,466
[45] Date of Patent: Aug. 2, 1994

[54] X-RAY MASK AND PROCESS COMPRISING CONVEX-CONCAVE ALIGNMENT MARK WITH ALIGNMENT REFLECTION FILM

[75] Inventors: Juro Yasui; Kiyoshi Araki, both of Osaka, Japan

[73] Assignee: Matsushita Electric Industrial Co., Ltd., Osaka, Japan

[21] Appl. No.: 963,900

[22] Filed: Oct. 20, 1992

[30] Foreign Application Priority Data

Oct. 24, 1991 [JP] Japan .................... 3-277686
Oct. 28, 1991 [JP] Japan .................... 3-281080
Oct. 28, 1991 [JP] Japan .................... 3-281082

[51] Int. Cl.$^5$ .............................. G03F 9/00
[52] U.S. Cl. ........................ 430/5; 430/321; 378/34; 378/35
[58] Field of Search ............ 430/5, 321; 378/34, 378/35

[56] References Cited

U.S. PATENT DOCUMENTS 5,190,836 3/1993 Nakazawa et al. ........... 430/321

FOREIGN PATENT DOCUMENTS 62-20310 6/1987 Japan .
2-293748 3/1990 Japan .

Primary Examiner—Steve Rosasco
Attorney, Agent, or Firm—Willian Brinks Hofer Gilson & Lione

[57] ABSTRACT

An X-ray transmission film 2 of a SiN film is formed on the surface of a mask base 1. Formed on the surface of the X-ray transmission film 2 are an LSI pattern 3, and an alignment mark 4 composed of a convex portion 4a and a concave portion 4b. On the surface of the convex portion 4a is an alignment light reflection grating pattern 5 of a tungsten film. Formed on the surface of the concave portion 4b is a metal film 7 of a tungsten film.

With this arrangement, a laser light beam 13 does not reach a semiconductor substrate 30 through the alignment mark 4. Thus, when detecting a first-order reflection diffracted light beam 14 from the alignment mark 4 by means of a photodetector, there is no inclusion of unwanted reflected light beams from the semiconductor substrate 30.

11 Claims, 17 Drawing Sheets

X-RAY MASK AND PROCESS COMPRISING CONVEX-CONCAVE ALIGNMENT MARK WITH ALIGNMENT REFLECTION FILM

BACKGROUND OF THE INVENTION

This invention relates to an X-ray mask for use in the X-ray lithography in semiconductor device process, and further it pertains to a process of producing the X-ray mask.

High-density, high-speed semiconductor devices, specially large scale integrated (LSI) circuits, which have been developed in recent years, inevitably require the microstructure of the components. In semiconductor device process, the wavelength of light, used in a photolithographic process, plays an important role, since the shorter the wavelength is, the tinier the component becomes. Soft X-rays (hereinafter referred to just as "X-rays") have a very short wavelength, in the vicinity of 1 nm. X-ray lithography, using such an X-ray source, is most attractive as a next generation lithographic system, accordingly.

Generally, an X-ray mask for use in the X-ray lithography employs a thin X-ray transmission film composed of a light element material for minimizing damping that occurs as an X-ray passes through the X-ray mask, and an X-ray absorption film deposited on the X-ray transmission film composed of a heavy metal with an X-ray adsorbability for transferring patterns (i.e., the absorber patterns) onto a semiconductor substrate.

With reference to the accompanying drawings, the aforesaid conventional X-ray mask is now described below. FIG. 33 shows, in cross section, a conventional X-ray mask G. In the figure, the reference numeral 1 denotes a frame-like mask base of a Si substrate. Formed on the surface of the base 1 is an X-ray transmission film 2 (a membrane) of a SiN film. On the surface of the X-ray transmission film 2 are LSI patterns 3. Also, alignment marks 4 are formed on the X-ray transmission film 2. Both the LSI pattern 3 and the alignment mark 4 are X-ray absorbers of tungsten films.

The X-ray mask G is now detailed. The X-ray transmission film 2 with a thickness of 2 μm is formed on the surface of the base 1. On the surface of the X-ray transmission film 2 are the LSI pattern 3 and the alignment mark 4 with a thickness of 0.7 μm. Further, an etching is applied to the back of the base 1 within an exposure region for X-ray transmission.

The X-ray transmission film 2 may be composed of a Si film or a thin diamond film in place of a SiN film. As for the LSI pattern 3 and the alignment mark 4, a thin heavy metal film of Au, Ta or the similar materials may be used instead of using a tungsten film.

The X-ray lithography based on X-ray sources, however, suffers a drawback in that converging lenses for X-rays are nonexistent, because of which the step-and-repeat projection with demagnification is difficult to perform. As a result of this reason, a full-scale, vary tiny transfer pattern with the same size as an image pattern on a semiconductor substrate must be formed on the X-ray mask G.

For the foregoing X-ray lithography, the X-ray mask G is placed proximal to a semiconductor substrate 30 having thereon alignment marks 31 and a resist 32 on its surface, with a gap of, for example, about 20 μm between them (see FIG. 34). Then the X-ray mask G is aligned with respect to the semiconductor substrate 30. X-rays (synchrotron orbital radiation (SOR)) given off from an accumulation ring (not shown) and directed by beam lines are irradiated.

The X-ray lithographic system described above employs a detecting method for detecting possible misregistration between the X-ray mask G and the semiconductor substrate 30. In such a misregistration detecting method, the alignment mark 4, of a diffraction grating, formed on the X-ray mask G and the alignment mark 31, of a diffraction grating, formed on the semiconductor substrate 30 are at the same time irradiated with laser light beams (i.e., alignment light beams). Then the reflection diffracted light beam from the alignment mark 4 is compared with another from the alignment mark 31, which has been known as one of the most accurate alignment methods. This method will be detailed below.

As shown in FIG. 34, a laser light beam 13A incident upon the back of the X-ray mask G passes through the X-ray transmission film 2 so that the alignment mark 4 is irradiated. This results in the generation of reflection diffracted light beams. A first-order reflection diffracted light beam 14 of the reflection diffracted light beams is detected with a first photodetector (not shown). A laser light beam 13B, on the other hand, passes through a region of the X-ray transmission film 2 without the alignment mark 4 and irradiates the alignment mark 31 on the semiconductor substrate 30. This results in the generation of another first-order reflection diffracted light beam 15. The first-order reflection diffracted light beam 15 from the alignment mark 31 on the semiconductor substrate 30 is detected by a second photodetector (not shown). The first-order reflection diffracted light beam 14 is compared with the first-order reflection diffracted light beam 15 for phase difference, in order to detect a misregistration between the X-ray mask G and the semiconductor substrate 30.

However, in accordance with the above-described misregistration detecting method which uses the conventional X-ray mask G, a zero-order transmission diffracted light beam 16 is reflected by the surface of the semiconductor substrate 30 so that it again irradiates the alignment mark 4 to form an unwanted diffracted light beam 17 composed of a first-order transmission diffracted light beam. The trouble is that the unwanted diffracted light beam 17 diffracts with the first-order reflection diffracted light beam 14 necessary for detecting a misregistration. This results in the superposition of the first-order reflection diffracted light beam 14 and the unwanted diffracted light beam 17. The superimposed light beams are detected by the first photodetector. Considerable detection errors are likely to occur in detecting the first-order reflection diffracted light beam 14.

Additionally, the conventional X-ray mask G presents a further problem that detection errors may be caused not only by the aforesaid zero-order transmission diffracted light beam 16 but also by another first-order transmission diffracted light beam 18 or a high-order transmission diffracted light beam (not shown).

Further, the generation of transmission light beams that penetrate the X-ray transmission film 2 means that the first reflection diffracted light beam 14 used for the detection of misregistration has lower light strength compared to the laser light beam 13A irradiated upon the alignment mark 4. This results in a poor signal-to-noise (S/N) ratio.

Japanese published Patent Application 2-293748 discloses a technique to prevent an alignment light beam irradiated on the alignment mark 4 from passing through it (the alignment mark 4) as well as from finally reaching the semiconductor substrate 30. This prior art technique shows an X-ray mask with an alignment mark having on its surface an alignment light absorption film of colored gelatin. Such a proposed X-ray mask, however, has a disadvantage in that the light strength of a first-order reflection diffracted light beam used for detecting a misregistration cannot be intensified because the alignment light absorption film absorbs the alignment light beams. The prior art technique does not contribute to the improvement of S/N ratio.

SUMMARY OF THE INVENTION

The present invention was made with a view to overcoming the above-described problems. According to the present invention, a first-order reflection diffracted light beam, obtained by the irradiation of a laser light beam serving as an alignment light beam upon an alignment mark of an X-ray mask, is unaffected by a transmission diffracted light beam.

The invention is based on the condition that the present X-ray mask has an X-ray transmission film on the surface of its mask base, and an alignment mark formed on the surface of the X-ray transmission film. The alignment mark on the X-ray transmission film has two portions, a convex portion and a concave portion in cross section so as to obtain first-order reflection diffracted light beams. Further, the surface of the alignment mark is covered with an alignment light reflection film so that no alignment light beams can pass through the alignment mark.

With this arrangement, no alignment light beams pass through the alignment mark provided on the X-ray mask, and the first-order reflection diffracted light beam, caused by the presence of the alignment mark, can evidently be detected without any interference by an unwanted reflected light beam.

Additionally, since the alignment light beam reflected by the alignment light reflection film is detected as the first-order reflection diffracted light beam, this achieves some threefold light signal strength compared to the conventional art techniques. Thus, the alignment of an X-ray mask with respect to a semiconductor substrate can much accurately be done.

The structure of each of the X-ray masks in accordance with the invention are described below.

A first X-ray mask of the invention is provided, which has an X-ray transmission film formed on the surface of a mask base, and an alignment mark formed on the surface of the X-ray transmission film wherein (a) the surface of the X-ray transmission film is formed alternately into a grating form as well as into a sectionally uneven form to form the alignment mark having a convex portion and a concave portion, and (b) the convex portion and the concave portion of the alignment mark have on their surfaces respective alignment light reflection films.

For the first X-ray mask, the surface of the X-ray transmission film becomes recessed in a grating form to form the concave portion of the alignment mark. The convex portion, on the other hand, is a resulting flat portion defined between the concave portions. This simplifies the formation of an uneven surface in cross section on the X-ray transmission film.

For the first X-ray mask, if the alignment light reflection film formed on the surface of the convex portion of the alignment mark is composed of an X-ray absorber, it (the alignment light reflection film) can be formed together with an LSI pattern in the same step. This results in high-accuracy of the relative positions of an LSI pattern and an alignment mark.

A method of producing the first X-ray mask comprises the steps of: (a) forming an X-ray transmission film on the surface of a mask base, (b) forming an alignment light reflection grating pattern, which is made up of an alignment light reflection film in a grating form, on the surface of the X-ray transmission film, (c) forming, by the application of an etching to the X-ray transmission film wherein the alignment light reflection grating pattern is used as a resist mask, an alignment mark composed of a concave portion in a grating form that is a recess formed on the X-ray transmission film, and a convex portion made up of a flat region defined between the concave portions, on the surface of the X-ray transmission film, and (d) forming an alignment light reflection film on the surface of the alignment mark.

A second X-ray mask of the invention is provided, which has an X-ray transmission film formed on the surface of a mask base, and an alignment mark formed on the surface of the X-ray transmission film wherein: (a) an alignment light reflection grating pattern in a grating form made up of a first alignment light reflection film is formed on the surface of the X-ray transmission film, while an alignment light transmission film in a grating form is formed on the other surface region of the X-ray transmission film without having thereon the alignment light reflection grating pattern, a second alignment light reflection film being formed on the surface of the alignment light transmission film, and (b) the alignment mark is made up of a convex portion composed of the X-ray transmission film and the alignment light transmission film, and a concave portion composed of a surface region of the X-ray transmission film corresponding to the back of the alignment light reflection grating pattern.

For the second X-ray mask, if the first alignment light reflection film is composed of an X-ray absorber, the alignment light reflection grating pattern can be formed together with an LSI pattern in the same step. This results in high-accuracy of the relative positions of an LSI pattern and an alignment mark, and further results in the easy and reliable production of the masks.

A method of producing the second X-ray mask comprises the steps of: (a) forming an X-ray transmission film on the surface of a mask base, (b) forming an alignment light reflection grating pattern, which is made up of a first alignment light reflection film in a grating form, on the surface of the X-ray transmission film, (c) forming, by forming an alignment light transmission film in a grating form on a region of the surface of the X-ray transmission film without having thereon the alignment light reflection grating pattern, an alignment mark composed of a convex portion made up of the X-ray transmission film and the alignment light transmission film, and a concave portion composed of a surface region of the X-ray transmission film corresponding to the back of the alignment light reflection grating pattern, and (d) forming a second alignment light reflection film on the surface of the alignment light transmission film.

A third X-ray mask of the invention is provided, which has an X-ray transmission film formed on the surface of a mask base, and an alignment mark formed on the surface of the X-ray transmission film wherein: (a) the alignment mark is made up of a convex portion in a grating form which is made of the X-ray transmission film and projects in a surface direction, and a concave portion which is made of the X-ray transmission film and recesses into a grating form between the convex portions in a back direction, the convex and concave portion having the same thickness, and (b) the convex portion and the concave portion have on their surfaces an alignment light reflection film.

A method of producing the third X-ray mask comprising the steps of: (a) forming a grating pattern in a grating form as well as in a cross-sectionally convex form on the surface of a mask base by the application of an etching to a region of the surface of the mask base where an alignment mark is to be formed, (b) forming an X-ray transmission film having a roughly uniform thickness on the surface of the mask base, (c) forming an alignment light reflection film on a region of the surface of the X-ray transmission where the alignment mark is to be formed, and (d) forming, by removing at least a portion of the mask base corresponding to the alignment mark to be formed, the alignment mark composed of a convex portion in a grating form which is made of the X-ray transmission film and projects in a surface direction, and a concave portion which is made of the X-ray transmission film and recesses between the convex portions in a back direction wherein the convex and the concave portions have the same thickness.

A fourth X-ray mask of the invention is provided, which has an X-ray transmission film formed on the surface of a mask base, and an alignment mark formed on the surface of the X-ray transmission film wherein: (a) an alignment light transmission grating pattern in a grating form made up of an alignment light transmission film is formed on the surface of the X-ray transmission film, (b) the alignment mark is made up of a convex portion composed of the alignment light transmission grating pattern on the X-ray transmission film and the X-ray transmission film, and a concave portion composed of a flat region of the X-ray transmission film without having thereon the alignment light transmission grating pattern, and (c) an alignment light reflection film is formed on the surface of the alignment mark.

A method of producing the fourth X-ray mask of the invention comprises the steps of: (a) forming an X-ray transmission film on the surface of a mask base, (b) forming an alignment light transmission film at least on a region of the surface of the X-ray transmission film where an alignment mark is to be formed, (c) forming, by the application of an etching to the alignment light transmission film to form an alignment light transmission grating pattern in a grating form made of the alignment light transmission film, the alignment mark composed of a convex portion made up of the alignment light transmission grating pattern on the X-ray transmission film and the X-ray transmission film, and a concave portion made of a region of the X-ray transmission film without having thereon the alignment light transmission grating pattern, and (d) forming an alignment light reflection film on the surface of the alignment mark.

A fifth X-ray mask of the invention is provided, which has an X-ray transmission film formed on the surface of a mask base, and an alignment mark formed on the surface of the X-ray transmission film wherein: (a) an alignment light transmission grating pattern in a grating form, made up of an alignment light transmission film, is formed on the back of the X-ray transmission film so that the back of the alignment light transmission grating pattern and the back of the X-ray transmission film are coplanar, and a grating-like projecting portion in a grating form which is a projecting portion of the X-ray transmission film projecting in its surface direction is correspondingly formed to the alignment light transmission grating pattern, (b) the alignment mark is made up of a convex portion composed of the grating-like projection portion of the X-ray transmission film and the alignment light transmission grating pattern, and a concave portion composed of a flat region of the X-ray transmission film without having thereon the grating-like projecting portion, and (d) an alignment light reflection film is formed on the surface of the alignment mark.

For the fourth or fifth X-ray mask, if both the X-ray transmission film and the alignment light transmission grating pattern are formed of materials capable of diminishing the index of reflection of alignment light at the interface of the X-ray transmission and the alignment light transmission grating pattern below a determined value, this prevents the reflection of alignment light between the X-ray transmission film and the alignment light transmission grating pattern.

A method of producing the fifth X-ray mask comprises the steps of: (a) forming an alignment light transmission grating pattern in a grating form made of an alignment light transmission film at least on a region of the surface of a mask base where an alignment mark is to be formed, (b) forming, by forming an X-ray transmission film on the surface of the mask base, a grating-like projecting portion in a grating form, which is a projecting portion of the X-ray transmission film projecting in its surface direction and is located correspondingly to the alignment light transmission grating pattern, on the X-ray transmission film, (c) forming an alignment light reflection film on a region of the surface of the X-ray transmission film where the alignment mark is to be formed, and (d) forming, by removing at least a portion of the mask base corresponding to the alignment mark to be formed, the alignment mark composed of a convex portion made up of the grating-like projecting portion of the X-ray transmission film and the alignment light transmission grating pattern, and a concave portion made up of a flat region of the X-ray transmission film without having thereon the grating-like projecting portion.

BRIEF DESCRIPTION OF THE DRAWINGS

FIG. 24 is a cross-sectional diagram illustrating an alignment of an X-ray mask of a fifth embodiment with respect to a semiconductor substrate.

FIGS. 25 through 30 are cross-sectional diagrams illustrating respective steps of producing the X-ray mask of the fifth embodiment.

DETAILED DESCRIPTION OF THE INVENTION

Referring to the accompanying drawings, preferred embodiments of the present invention are now described.

FIRST EMBODIMENT

Figure 1:
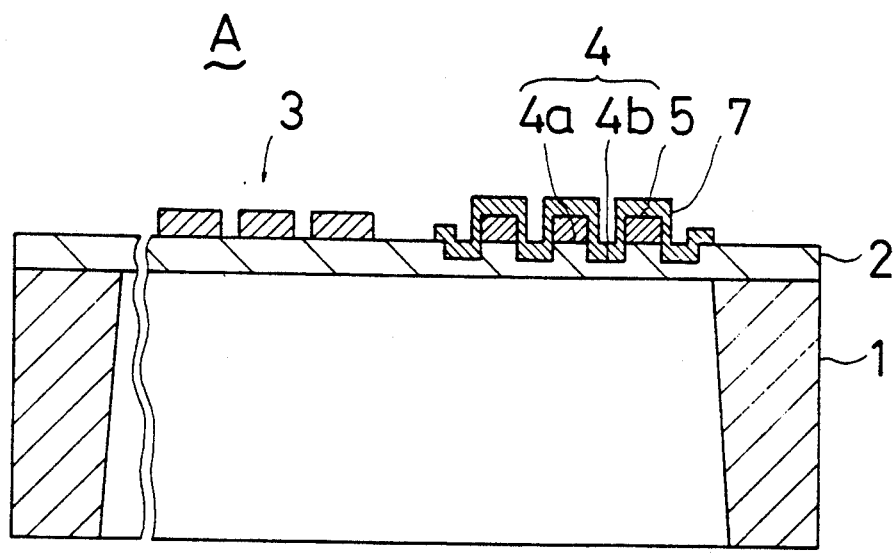
FIG. 1 shows, in cross section, an X-ray mask in accordance with a first embodiment of the present invention.

FIG. 1 shows, in cross section, the structure of an X-ray mask A of the first embodiment. The mask base 1 is a Si substrate. The X-ray transmission film 2, which is a SiN film, is formed on the surface of the base 1. The LSI patterns 3, which are tungsten films, are formed on the surface of the X-ray transmission film 2. The back of the base 1, corresponding to an exposure region for X-rays transmission, is removed by an etching.

The alignment marks 4, shown in FIG. 1, are formed on the surface of the X-ray transmission film 2. The alignment mark 4 is made up of a convex portion 4a in a grating form, and of a concave portion 4b (that is, a portion resulting from the formation of the convex portion 4a on the X-ray transmission film 2) in a grating form defined between the convex portions 4a.

Formed on the surface of the convex portion 4a of the alignment mark 4 is an alignment light reflection grating pattern 5 of a tungsten alignment light reflection film that is a reflector of alignment light beams. On the surfaces of both the concave portion 4b and the alignment light reflection grating pattern 5 is a metal film 7 which is a tungsten alignment light reflection film.

In the first embodiment of the invention, the metal film 7 is so formed that it covers not only the surface of the concave portion 4b of the alignment mark 4 but also that of the alignment light reflection grating pattern 5, for reasons of the manufacturing technique of the X-ray mask A. The metal film 7, however, may be formed only on the surface of the concave portion 4b.

Figure 2:
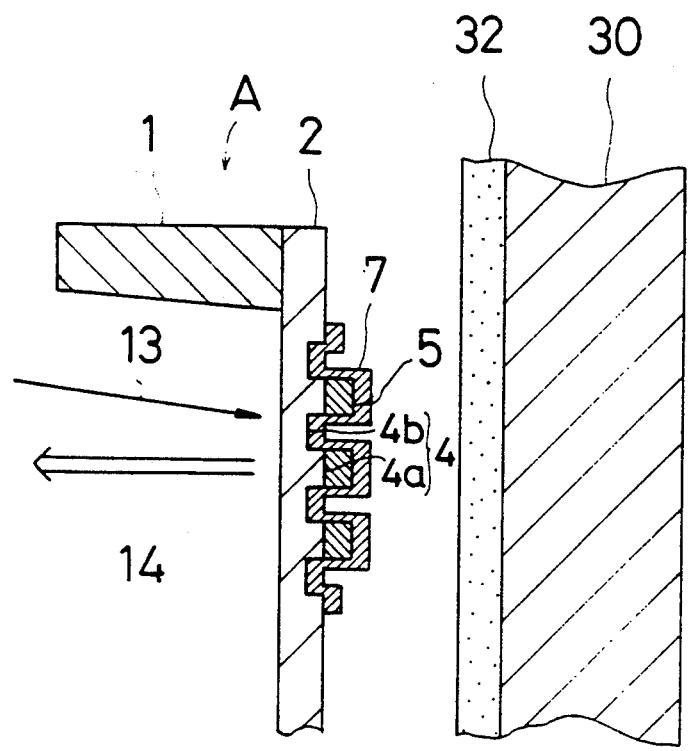
FIG. 2 is a cross-sectional diagram illustrating an alignment of the X-ray mask of the first embodiment with respect to a semiconductor substrate.

With reference to FIG. 2, a detecting method, which is used to detect a misregistration between the X-ray mask A and the semiconductor substrate 30 having on its surface the resist 32. FIG. 2 partly illustrates, in cross section, an alignment of the X-ray mask A with respect to the semiconductor substrate 30, wherein the reference numeral 13 denotes a laser light beam with which the alignment mark 4 of the X-ray mask A is irradiated, and the reference numeral 14 shows a first-order reflection diffracted light beam caused by the laser light beam 13 irradiating the alignment mark 4.

Figure 33:
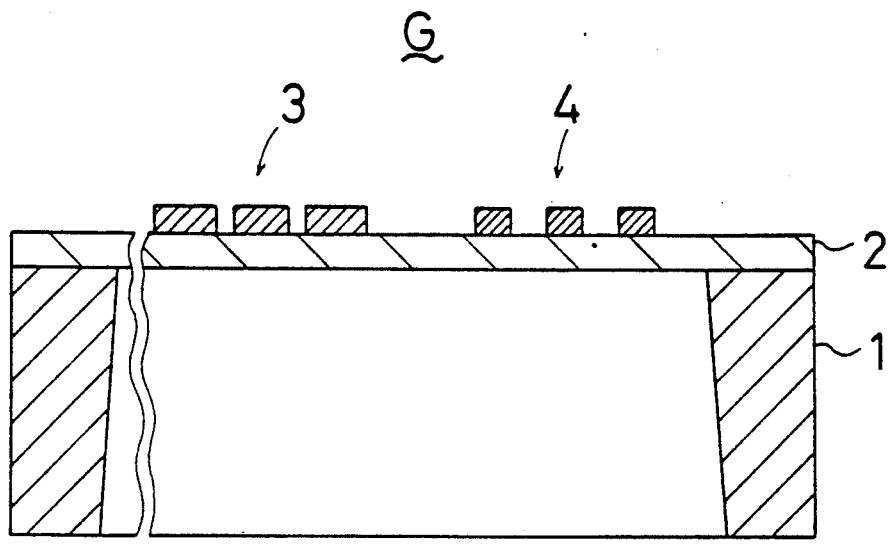
FIG. 33 illustrates, in cross section, a conventional X-ray mask.
Figure 34:
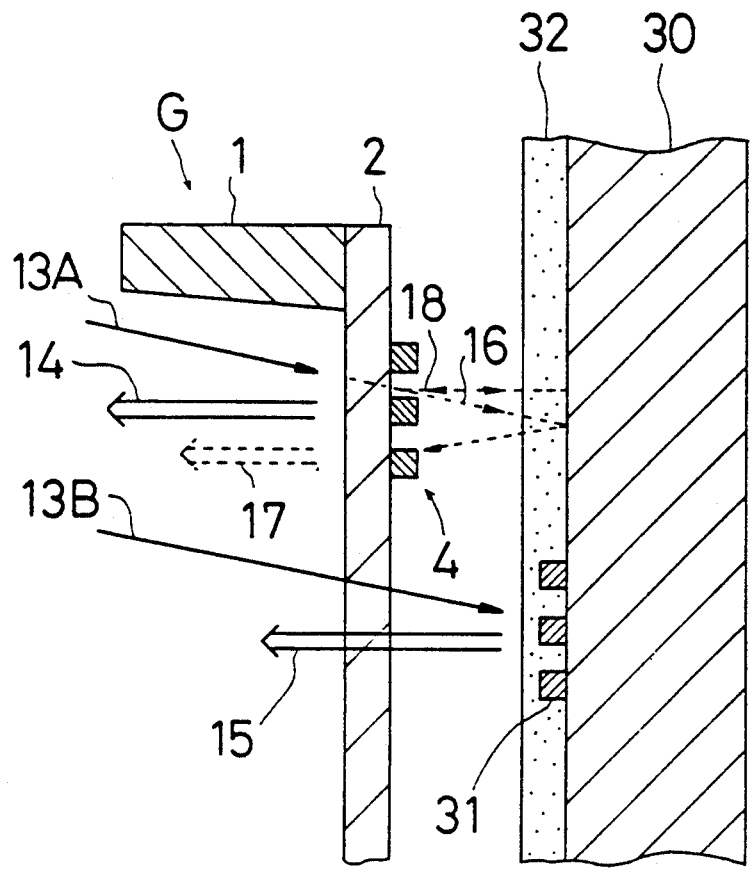
FIG. 34 is a cross-sectional diagram illustrating an alignment of a conventional X-ray mask with respect to a semiconductor substrate.

As shown in FIG. 2, the semiconductor substrate 30 is placed with taking an appropriate gap to the surface (the top in FIG. 1 or the right side in FIG. 2) of the X-ray mask A. In positioning the X-ray mask A to the semiconductor substrate 30, the laser light beam 13 is irradiated through the back of the X-ray mask A onto the alignment mark 4. Diffraction effects due to the transmission of the laser light beam 13 through the alignment mark 4 are nonexistent, since the alignment light reflection grating pattern 5 and the metal film 7 both made of tungsten films do not allow the laser light beam 13 to pass through them. No transmission diffracted light beams reach the semiconductor substrate 30 by way of the alignment mark 4. Thus, the foregoing disadvantages of the prior art techniques have been overcome, that is, the zero-order transmission diffracted light beam 16, the first-order transmission diffracted light beam 18, and the high-order transmission diffracted light beam as shown in FIG. 33 are all nonexistent. Detecting errors due to the zero-order, first-order or high-order transmission diffracted light beam can be avoided.

As the alignment mark 4 is irradiated through the back of the X-ray mask A by the laser light beam 13, the laser light beam 13 is reflected by the alignment light reflection grating pattern 5 as well as by the metal film 7 both made from a tungsten film to cause the first-order reflection diffracted light beam 14. It is known that the strength of the first-order reflection diffracted light beam 14 periodically varies depending upon the level difference between the convex portion 4a and the concave portion 4b of the alignment mark 4 formed on the X-ray transmission film 2 which makes up a diffraction grating. The strength of the first-order reflection diffracted light beam 14 can therefore be maximized by controlling the etching depth of the concave portion 4b.

As the laser light beam 13 is reflected by both tungsten films covering the surfaces of the convex portion 4a and the concave portion 4b of the alignment mark 4, the strength of the first-order reflection diffracted light beam 14 becomes greater than such a case that only one of either of the surfaces of the convex portion 4a and the concave portion 4b is covered with a tungsten film wherein the laser light beam 13 is reflected only by the one coated surface. For example, when X-ray transmission film 2 is formed of a SiN film with an index of refraction of 2.5 and the laser light beam (He—Ne) 13, having a wavelength of 0.633 μm, is incident through the X-ray transmission film 2 upon a diffraction grating with a pitch of 4 m at an angle of incidence of 9°, the strength of the first-order reflection diffracted light beam 14 reaches a maximum when the level difference between the convex portion 4a and the concave portion 4b of the alignment mark 4 is 0.06 or 0.19 μm.

A process of the X-ray mask A of the first embodiment is described with the help of FIGS. 3 through 6.

Figure 3:
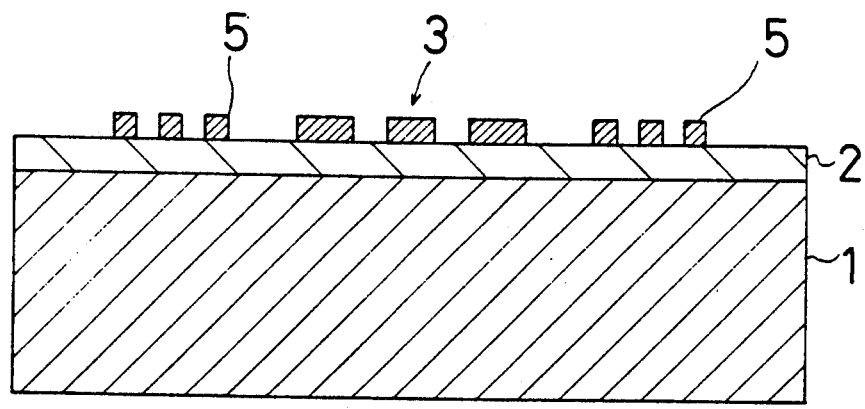
FIGS. 3 through 6 are cross-sectional diagrams illustrating respective steps of producing the X-ray mask of the first embodiment.

As in the conventional production process of X-ray masks, the X-ray transmission film 2 of a SiN film with a film thickness of, for example, 2 μm is formed on the surface of the base 1 of a S1 substrate without any etching treatment on its back (see FIG. 3). Then a tungsten film 0.7 μm thick is formed on the top of the X-ray transmission film 2. An etching is applied to the aforesaid tungsten film by electron beam lithography or reactive dry etching whereby defining on the surface of the X-ray transmission film 2 the LSI pattern 3 as well as the alignment light reflection grating pattern 5 both composed of the tungsten film.

Figure 4:
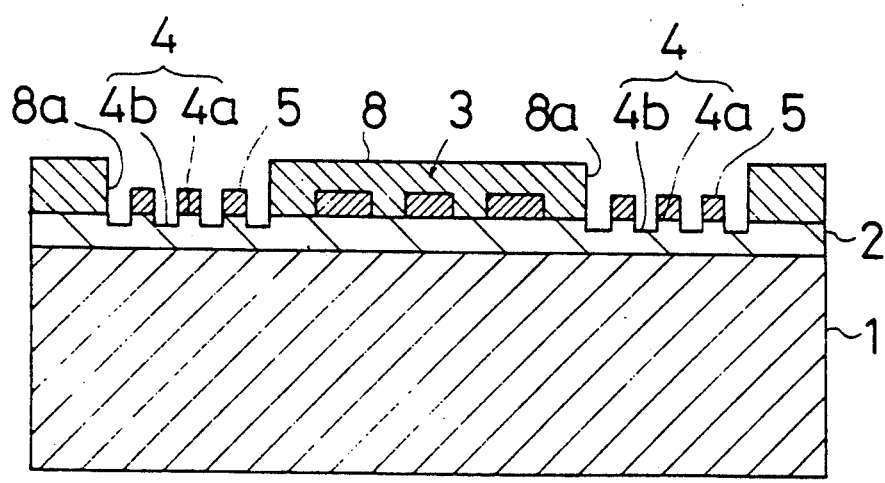
Figure 5:
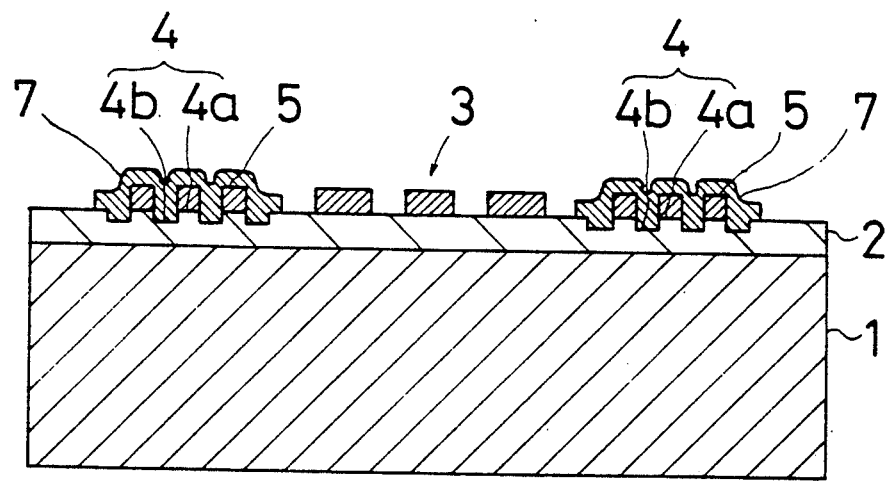

Next, as shown in FIG. 4, a resist mask 8 with an opening 8a for the formation of the alignment mark 4 is formed on the surface of the X-ray transmission film 2 by photolithography. Thereafter, the X-ray transmission film 2 is engraved by a required depth by reactive dray etching. As described above, the alignment light reflection grating pattern 5 has already been formed on the surface of the X-ray transmission film 2, and the resist mask 8 has the opening 8a. This results in the formation of the alignment mark 4 comprising the convex portion 4a and the concave portion 4b on the surface of the X-ray transmission film 2, since the etching is carried out only on particular portions of the X-ray transmission film 2 corresponding to the opening 8a and having thereon no alignment light reflection grating pattern 5.

When applying etching treatment to the X-ray transmission film 2 by using the alignment light transmission grating pattern 5 as a mask (that is, when the resist mask 8 is not employed), the etching may also be applied to a region where the LSI pattern 3 is formed.

Formed on the surface of the alignment mark 4 is the metal film 7 serving as an alignment light reflection film having a cross-sectionally uneven form. The metal film 7 is made of, for example, a tungsten film 0.2 μm thick. The uneven metal film 7 may be formed through sputtering, wherein a tungsten film is first formed on the surface of the X-ray transmission film 2, with the resist mask 8 (used for the etching with respect to X-ray transmission film 2 at the previous step) remaining thereon, and the tungsten film thus formed on the resist mask 8 together with the resist mask 8 is removed by the lift-off technique.

Other than the above-noted lift-off technique, there are other methods for forming the metal film 7. For instance, first the metal film 7 may be formed all over the surface of the semiconductor substrate 1, and the metal film 7 thus formed is left only on the surface of the alignment mark 4 by photolithography and etching. If the metal film 7 is formed of a material with a faster etching speed compared to the X-ray absorber comprising the alignment light reflection grating pattern 5, this leads to easy adoption of the photolithography and etching above mentioned.

Figure 6:
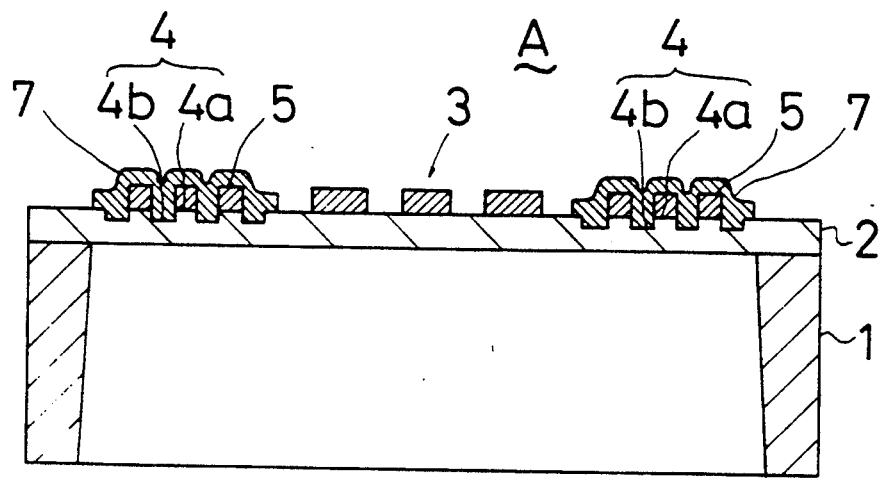

As shown in FIG. 6, the back of the base 1, corresponding to an exposure region for X-rays transmission, is removed by a conventional etching technique to form it (the base 1) into a frame form.

This forms the alignment mark 4, comprised of the convex portion 4a and the concave portion 4b, on the surface of the X-ray transmission film 2. Formed on the surface of the convex portion 4a is the alignment light reflection grating pattern 5 that is a tungsten film. The metal film 7 of a tungsten film is provided on the surface of the alignment light reflection grating pattern 5 as well as on that of the concave portion 4b. Thus, the X-ray mask A in accordance with this embodiment can be manufactured easily and reliably.

SECOND EMBODIMENT

Figure 7:
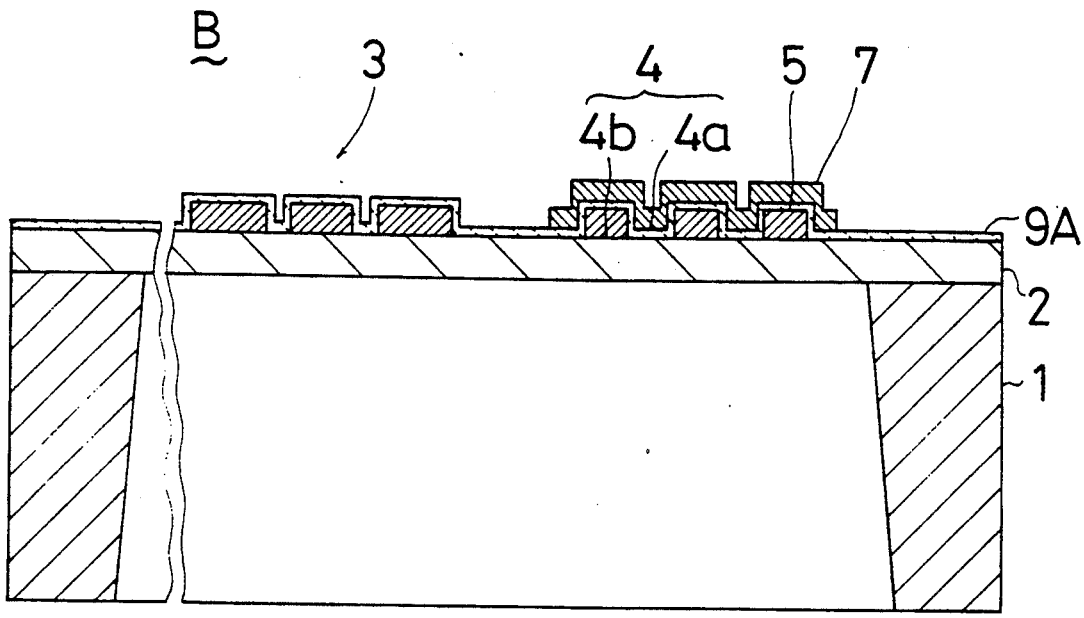
FIG. 7 shows, In cross section, an X-ray mask in accordance with a second embodiment of the present invention.

An X-ray mask B in accordance with a second embodiment of the present invention is illustrated, in cross section, in FIG. 7.

Like the first embodiment, the X-ray transmission film 2 of a SiN film is formed on the surface of the base 1 of a Si substrate. The second embodiment, however, differs from the first embodiment in that the X-ray transmission 2 has an even surface. Formed on the surface of the X-ray transmission film 2 are the LSI pattern 3 that is a tungsten film, and the alignment light reflection grating pattern 5, as a first alignment light reflection grating film, that is a tungsten film in a grating form.

The surfaces of the X-ray transmission film 2, each LSI pattern 3, and each alignment light reflection grating pattern 5 are entirely covered with an alignment light transmission film 9A that is a SiO$_2$ film. This forms the alignment mark 4 on the X-ray transmission film 2. The alignment mark is composed of the convex portion 4a and the concave portion 4b. The former is made up of the X-ray transmission film 2 and the alignment light transmission film 9A, and projects in the surface direction, while the latter is made up of a flat surface portion of the X-ray transmission film 2. Additionally, formed entirely on the surface of the alignment mark 4 is the metal film 7, serving as a second alignment light reflection film, of a tungsten film. For the transmission of X-rays, the back of the base 1, corresponding to an exposure region, is removed by an etching.

A method of detecting a misregistration between the X-ray mask B and the semiconductor substrate is the same as the one employed for the X-ray mask A of the first embodiment. Even if the alignment mark 4 of the X-ray mask B is irradiated from the back with laser light beams, diffracted light beams arriving through the alignment mark 4 at the semiconductor substrate 30 are nonexistent because of the presence of the alignment light reflection grating pattern 5 and the metal film 7 made from tungsten films which prevent the transmission of the laser light beams. Detection errors due to zero-order, first-order or high-order transmission diffracted light beam can be prevented.

Figure 8:
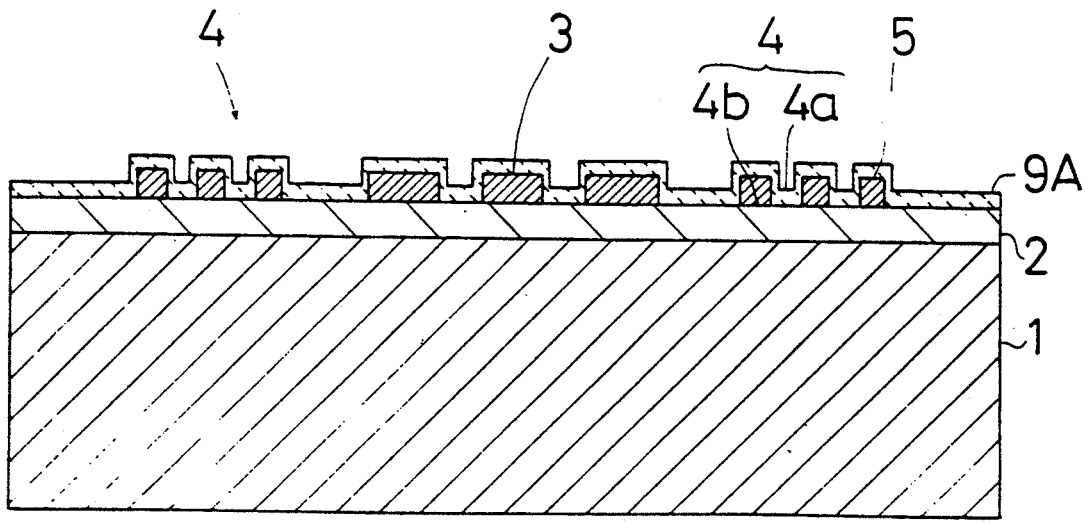
FIGS. 8 through 10 are cross-sectional diagrams illustrating respective steps of producing the X-ray mask of the second embodiment.
Figure 9:
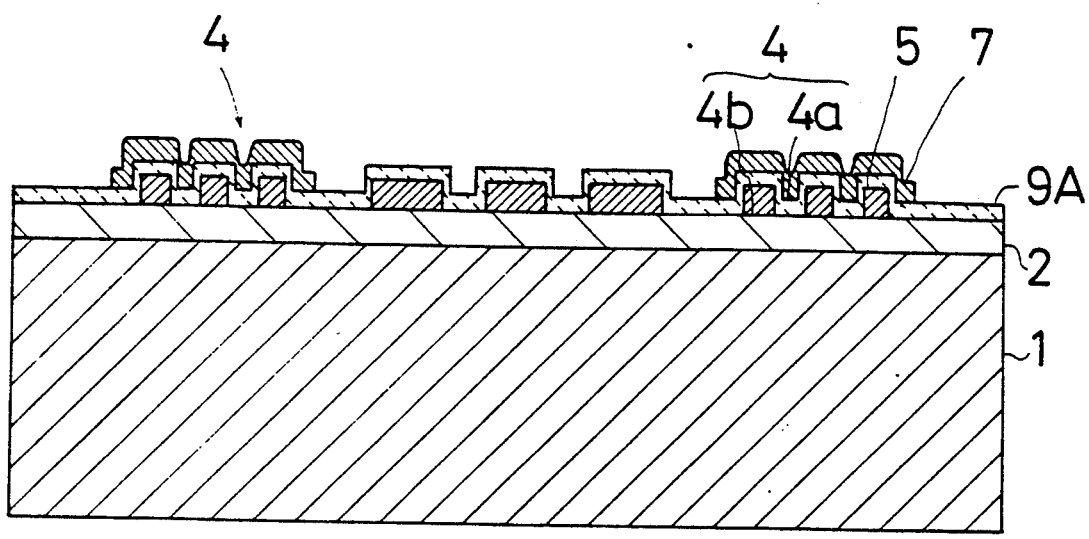
Figure 10:
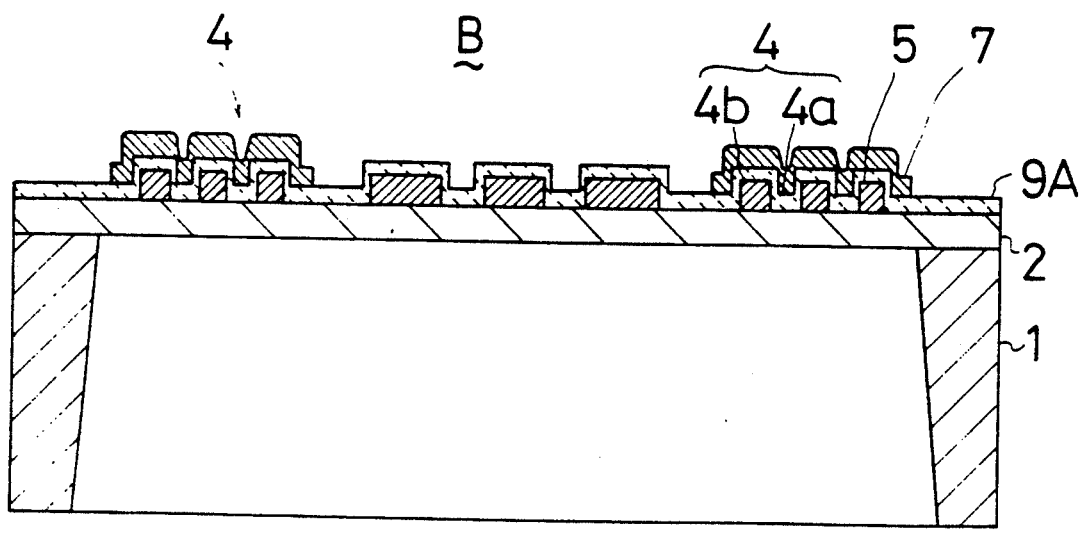

Reference is now made to FIGS. 8 through 10 to illustrate a process of producing the X-ray mask B of the second embodiment.

Like the production method of the X-ray mask A of the first embodiment, the X-ray transmission film 2 of a SiN film is formed on the surface of the mask base 1 of a Si substrate without any etching treatment on its back. On the surface of the X-ray transmission film 2, the LSI pattern 3 and the alignment light reflection grating pattern 5 serving as a first alignment light reflection film both made from a tungsten film are formed.

Then the alignment light transmission film 9A of a SiO$_2$ film 0.1 μm thick is formed all over the surfaces of the X-ray transmission film 2, each LSI pattern 3, and each alignment light reflection grating pattern 5, which is shown in FIG. 8. In this way, the alignment light transmission film 9A is deposited between the alignment light reflection grating patterns 5 on the X-ray transmission film 2 to form the convex portion 4a of the alignment mark 4, while the X-ray transmission film 2, facing the back of the alignment light reflection grating pattern 5, forms the concave portion 4b of the alignment mark 4.

The metal film 7 made from, for example, a tungsten film 0.2 μm thick is formed on the X-ray transmission film 2, which serves as a second alignment light reflection film, and has a cross-sectionally uneven form. As one of the methods of forming the metal film 7, such may be applicable that a tungsten film is first formed over the entire surface of the mask base 1, and thereafter the tungsten film is left only on the surface of the alignment mark 4 by means of photolithography. Alternatively, a tungsten film may selectively be formed using a resist mask having an opening in a corresponding region to the alignment mark 4.

Following on the above, the back of the base 1, corresponding to an exposure region for X-rays transmission, is removed by a conventional etching technique (FIG. 10).

As described above, the alignment mark 4, comprised of the convex portion 4a and the concave portion 4b, is formed on the surface of the X-ray transmission film 2. Formed on the surface of the convex portion 4a is the metal film 7 serving as a second alignment light reflection film. The alignment light reflection grating pattern 5 (i.e., a first alignment light reflection film) is formed on the surface of the concave portion 4b. In this way, the X-ray mask B can be manufactured easily and reliably.

THIRD EMBODIMENT

Figure 11:
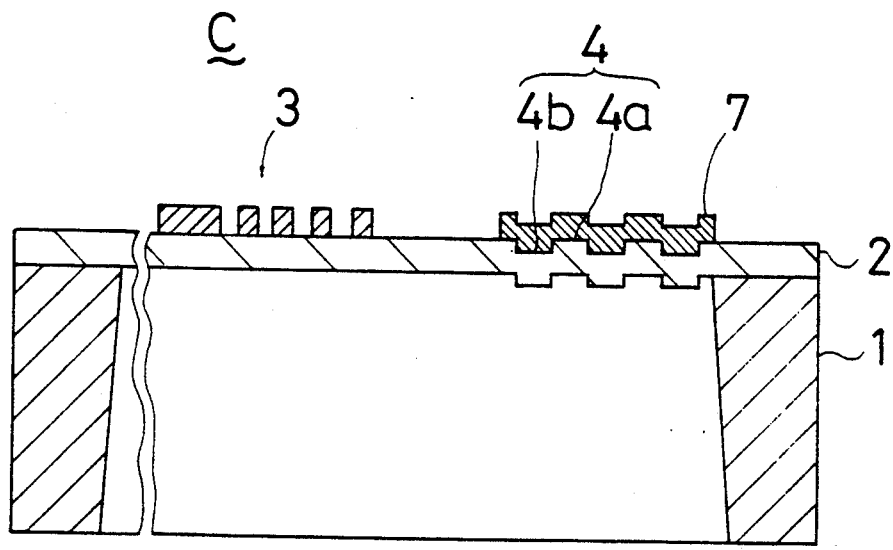
FIG. 11 shows, in cross section, an X-ray mask in accordance with a third embodiment of the present invention.

An X-ray mask C in accordance with a third embodiment of the present invention is illustrated, in cross section, in FIG. 11. Like the foregoing embodiments, the LSI patterns 3 made from tungsten films are formed on the surface of the base 1 of a S1 substrate.

The third embodiment is characterized in that the alignment mark 4 is composed of the concave portion 4b in a grating form which is formed by means of the application of etching to the surface of the X-ray transmission film 2, and of the convex portion 4a in a grating form which results from the formation of the concave portion 4b on the X-ray transmission film 2, and is further characterized in that the tungsten metal film 7 as an alignment light reflection film is formed entirely on the surface of the alignment mark 4. Further, for reasons of manufacturing techniques and strength aspects, a portion of the back of X-ray transmission film 2, corresponding to the back of the concave portion 4b, projects backward.

Figure 12:
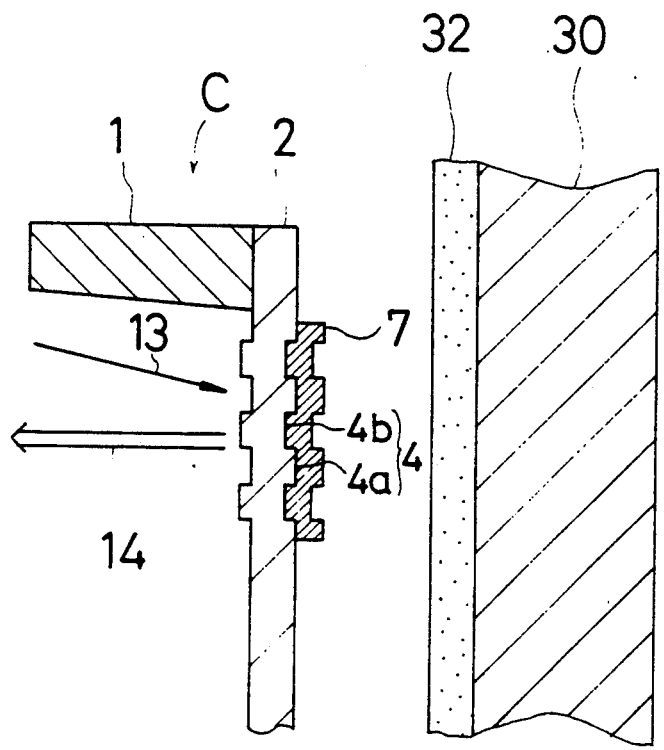
FIG. 12 is a cross-sectional diagram illustrating an alignment of the X-ray mask of the third embodiment with respect to a semiconductor substrate.

A method of detecting a misregistration between the X-ray mask C to the semiconductor substrate 30 is illustrated in FIG. 12, which is the same as the one employed for the X-ray mask A of the first embodiment. The alignment mark 4 of the X-ray mask C is irradiated from the back with the laser light beam 13. Diffracted light arriving through the alignment mark 4 at the semiconductor substrate 30 is nonexistent because of the presence of the tungsten metal film 7 which prevents the transmission of the laser light beam 13. Detection errors due to zero-order, first-order or high-order transmission diffracted light beam can be prevented.

It is known that the strength of the first-order reflection diffracted light beam 14, resulting from the reflection of the laser light beam 13 by the metal film 7 on the surface of the alignment mark 4, periodically varies depending on the level difference between the convex portion 4a and the concave portion 4b of the alignment mark 4. Accordingly, the strength of the first-order reflection diffracted light beam 14 can be maximized by controlling the depth of the concave portion 4b of the alignment mark 4. For example, when the laser light beam (He—Ne) 13, having a wavelength of 0.633 μm, is incident upon the alignment mark 4 composed of diffraction gratings with a pitch of 4 μm at an angle of incidence of 9°, the strength of the first-order reflection diffracted light beam 14 which is reflected perpendicularly in relation to the X-ray mask C reaches a maximum when the level difference between the diffraction gratings (diffraction patterns) is 0.16 or 0.32 μm.

With reference to FIGS. 13 through 16, a process of producing the X-ray mask C of the third embodiment is now described.

Figure 13:
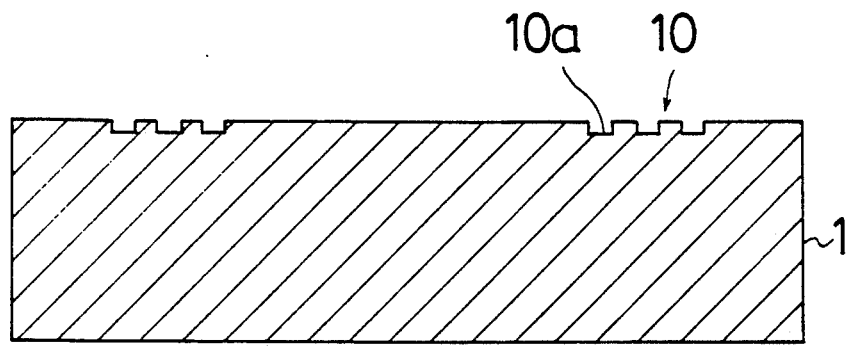
FIG. 13 is a cross-sectional diagram illustrating a step of producing the X-ray mask of the third embodiment.
Figure 14:
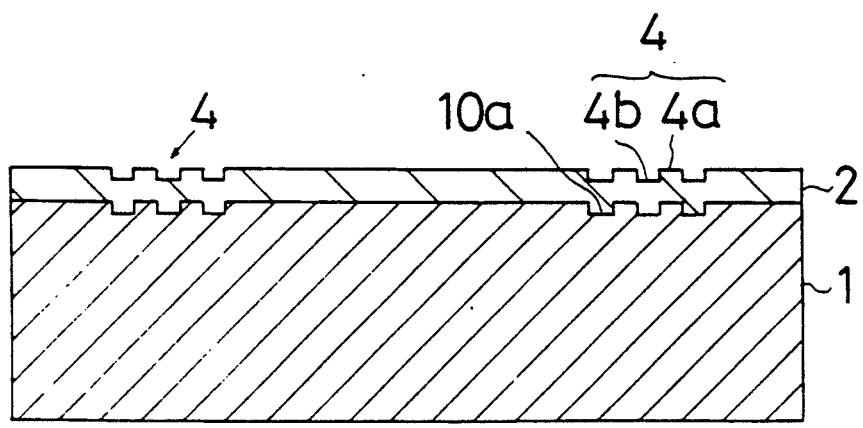
FIGS. 14 through 16 are cross-sectional diagrams illustrating respective steps of producing the X-ray mask of the third embodiment.
Figure 15:
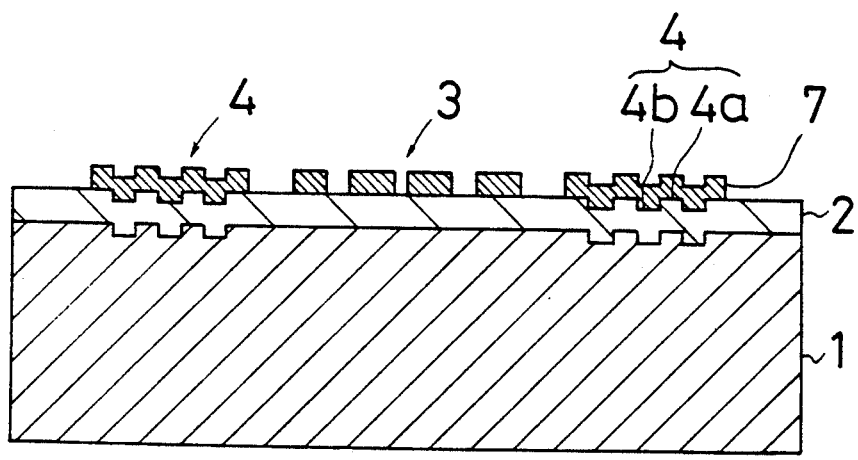

40 linear concave patterns 10a (for example, with a depth of 0.3 μm, width of 2 μm and length of 150 μm) are formed at 2 μm intervals on the surface of the Si base 1 without any etching treatment on its back, whereby a grating pattern 10 with a 4 μm pitch is formed on a corresponding surface region of the base 1 to the alignment mark 4 to be formed on the X-ray transmission film 2 (FIG. 13).

Formed entirely over the surface of the base 1 is the X-ray transmission 2 of a SiN film. In this way, each of the alignment marks 4 made up of the convex portion 4a and the concave portion 4b is formed according to the unevenness of the grating pattern 10.

Then a tungsten film 0.7 μm thick, which is an X-ray absorber as well as an alignment light reflection film, is entirely formed on the surface of the X-ray transmission film 2. The tungsten film is processed by electron beam lithography or reactive dry etching thereby defining on the surface of the X-ray transmission film 2 the LSI pattern 3 which is a tungsten film, and the metal film 7 which is a tungsten film on the surface of the alignment mark 4.

Figure 16:
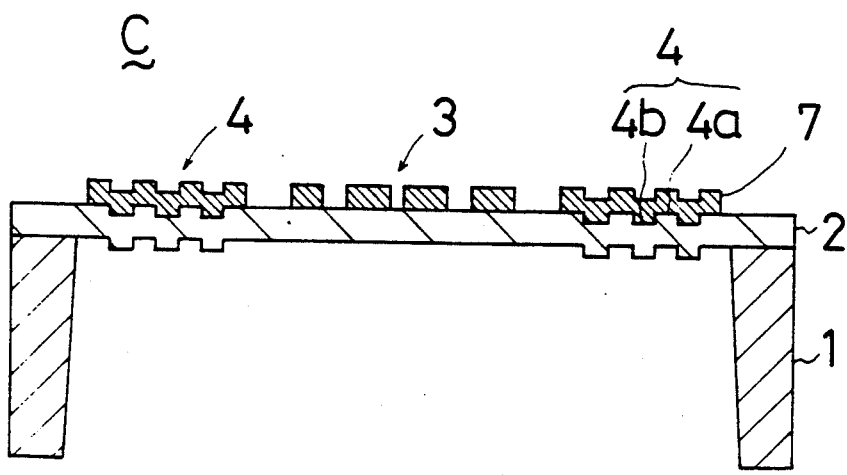

As shown in FIG. 16, the back of the base 1, corresponding to an exposure region for X-rays transmission is removed by a conventional etching technique to form it (the base 1) into a frame form.

In this way, the alignment mark 4, comprised of the convex portion 4a and the concave portion 4b, is formed on the surface of the X-ray transmission film 2, and the X-ray mask A with the metal film 7 of a tungsten film on the alignment mark 4 can be manufactured easily and reliably.

In accordance with the process of producing the X-ray mask C of the third embodiment, the X-ray transmission film of a SiN film is first formed, then the LSI pattern 3 and the metal film 7 both made from a tungsten film are formed, and thereafter the etching is applied to the region of the base 1 to be exposed. Alternatively, it is possible to take such steps wherein the X-ray transmission film of a SiN film is first formed, then the etching is applied to the region of the base 1 to be exposed, and thereafter the LSI pattern 3 and the metal film 7 both made from a tungsten film are formed.

FOURTH EMBODIMENT

Figure 17:
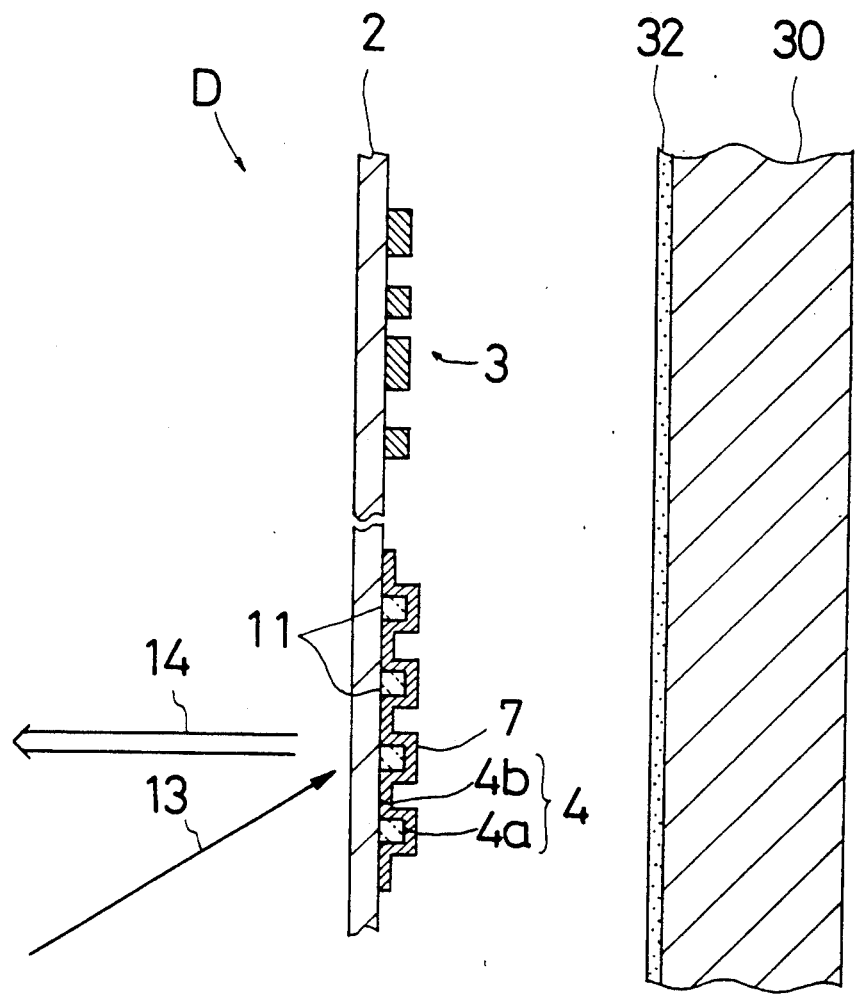
FIG. 17 is a cross-sectional diagram illustrating an alignment of an X-ray mask of a fourth embodiment with respect to a semiconductor substrate.

FIG. 17 illustrates, in cross section, an X-ray mask D of a fourth embodiment of the invention, and an alignment of the X-ray mask D with respect to the semiconductor substrate 30.

For the X-ray mask D of the fourth embodiment, the X-ray transmission film 2, which serves also as an alignment light transmission film, of a 2 μm thick SiN film is formed on the base (not shown). Formed on the surface of the X-ray transmission film 2 is an alignment light transmission grating pattern 11 made from an alignment light transmission film which is a SiO$_2$ film 0.1 μm thick. The convex portion 4a composed of the X-ray transmission film 2 and the alignment light transmission grating pattern 11, and the concave portion 4b composed of only the X-ray transmission film 2 together make up the alignment mark 4 in a grating form as well as in a cross-sectionally uneven form. Further, provided on the surface of the alignment mark 4 is the metal film 7 which is a 0.8 μm thick tungsten film and serves as an alignment light reflection film. The LSI patterns 3 of tungsten films are also formed on the surface of the X-ray transmission film 2.

When carrying out a misregistration detection of the X-ray mask D with respect to the semiconductor substrate 30, the alignment mark 4 of the X-ray mask D is irradiated from its back with the laser light beam 13 to obtain the first-order diffracted light beam 14. As the tungsten film making up the metal film 7 is a barrier to laser light beams, diffracted light arriving through the alignment mark 4 at the semiconductor substrate 30 is nonexistent, and detection errors due to zero-order, first-order or high-order transmission diffracted light can be prevented.

Referring to FIGS. 18 through 22, a process of producing the X-ray mask D of the fourth embodiment is described below.

Figure 18:
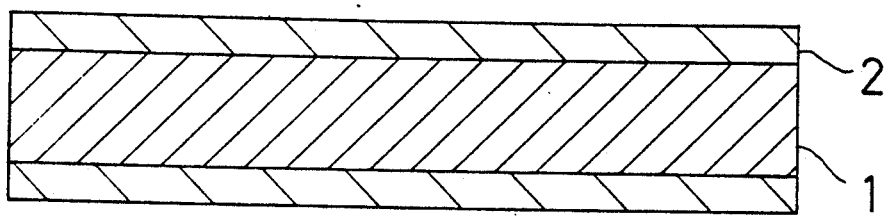
FIGS. 18 through 28 are cross-sectional diagrams illustrating respective steps of producing the X-ray mask of the fourth embodiment.
Figure 19:
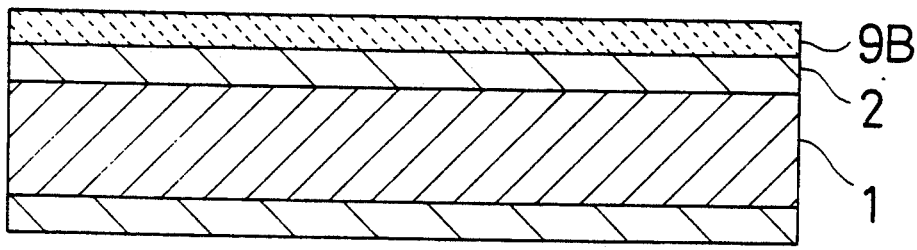
Figure 20:
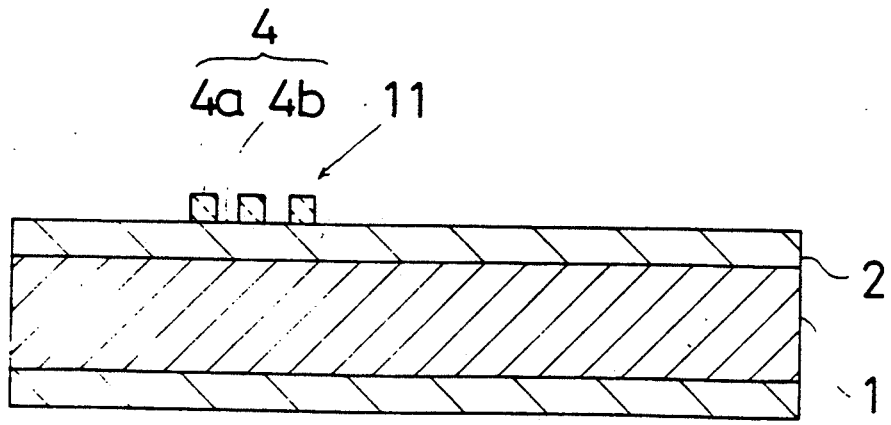

In the first place, as shown in FIG. 18, the X-ray transmission film 2 of a SiN film is formed on the surface of the Si base 1. Then, as shown in FIG. 19, an alignment light transmission film 9B of a 0.1 μm thick SiO$_2$ film is formed on the surface of the X-ray transmission film 2. Thereafter, a photolithographic process is applied to the alignment light transmission film 9B to form the alignment light transmission grating pattern 11 made of the alignment light transmission film 9B (FIG. 20). The convex portion 4a composed of the X-ray transmission film 2 and the alignment light transmission grating pattern 11, and the concave portion 4b composed of only the X-ray transmission film 2 together make up on the base 1 the alignment mark 4 in a grating form as well as in a cross-sectionally uneven form.

Figure 21:
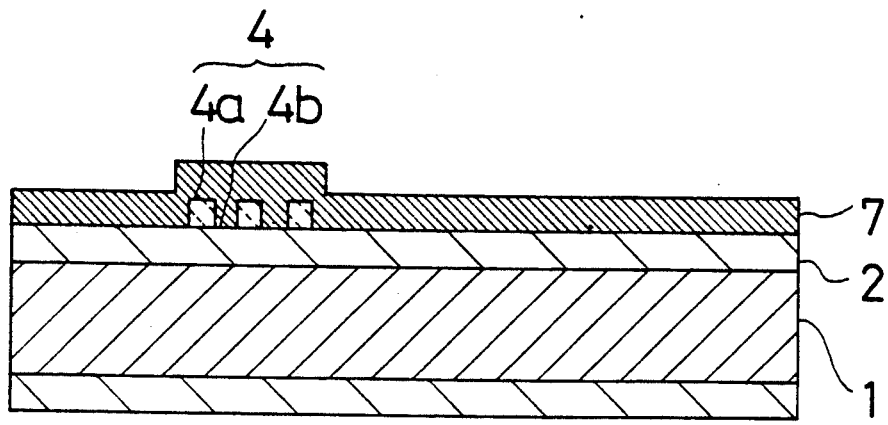
Figure 22:
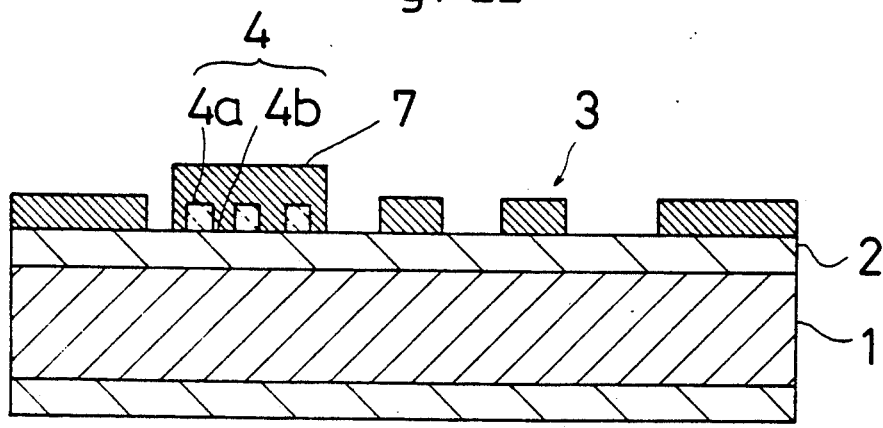
Figure 23:
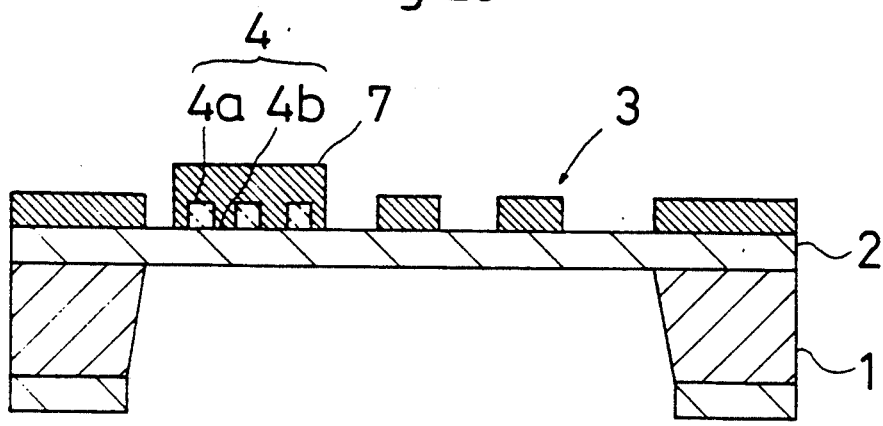

As shown in FIG. 21, the metal film 7, which is a 0.8 μm thick tungsten film and serves not only as an alignment light reflection film but also as an X-ray absorber, is formed all over the surfaces of the X-ray transmission film 2 and the alignment mark 4, Then a photolithographic process is applied to the metal film 7 so that the metal film 7 is left only on the surface of the alignment mark 4 (see FIG. 22). In accordance with this embodiment, the metal film 7 formed on the surface of the alignment mark 4 and the LSI pattern 3 are formed at the same time thorough the foregoing photolithographic process applied to the metal film 7. Thereafter, as shown in FIG. 23, the back of the base 1, corresponding to an exposure region for X-rays transmission, is etched to form it into a frame form.

FIFTH EMBODIMENT

Figure 24:
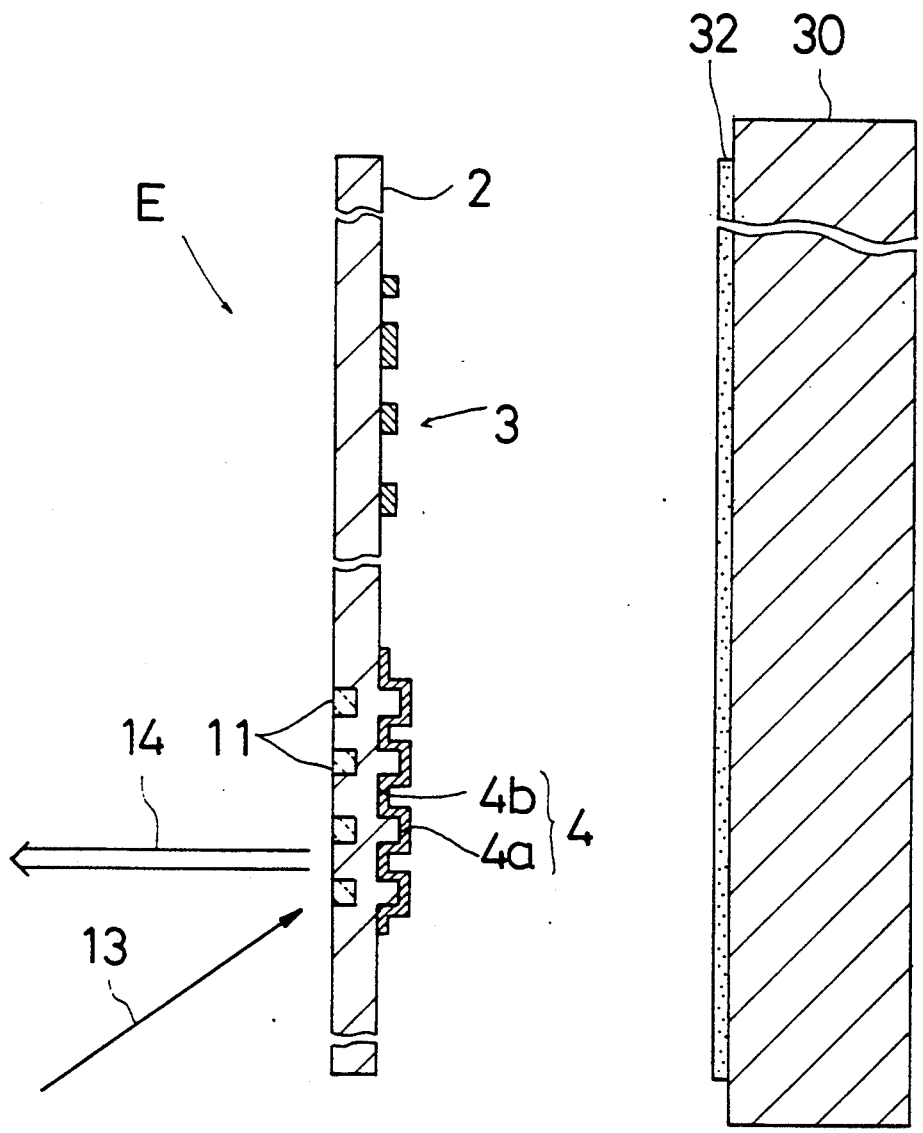

FIG. 24 illustrates, in cross section, an X-ray mask E of a fifth embodiment of the invention, and an alignment of the X-ray mask E with respect to the semiconductor substrate 30.

For the X-ray mask E of the fifth embodiment of the invention, the X-ray transmission film 2 (i.e., a Sin film 2 μm thick), formed on the surface of the base (not shown) and serving also as an alignment light reflection film, has on its surface projecting portions in a grating form. Provided on the back of the X-ray transmission film 2 are the alignment light transmission grating patterns 11, of a flat SiO$_2$ film, located correspondingly to the aforesaid projecting portions. The convex portion 4a composed of the projecting portion of the X-ray transmission film 2 and the alignment light transmission grating pattern 11, and the concave portion 4b composed of only the X-ray transmission film 2 together make up the alignment mark 4 in a grating form. In other words, the X-ray mask E of the fifth embodiment has the inverted deposition structure of an alignment light transmission grating pattern, with respect to the X-ray mask D of the fourth embodiment. Further, provided on the surface of the alignment mark 4 is the metal film 7 which is a 0.8 μm thick tungsten film and serves as an alignment light reflection film.

When carrying out a misregistration detection of the X-ray mask E to the semiconductor substrate 30, the alignment mark 4 of the X-ray mask E is irradiated from its back with the laser light beam 13 to obtain the first-order diffracted light beam 14. As the tungsten film making up the metal film 7 is a barrier to laser light beams, diffracted light arriving through the alignment mark 4 at the semiconductor substrate 30 is nonexistent, and detection errors due to zero-order, first-order or high-order transmission diffracted light can be prevented.

Referring to FIGS. 25 through 30, a process of producing the X-ray mask E of the fifth embodiment is now described.

Figure 25:
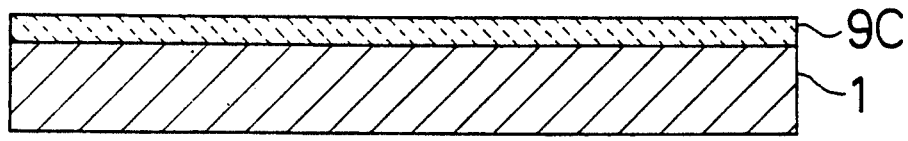
Figure 26:
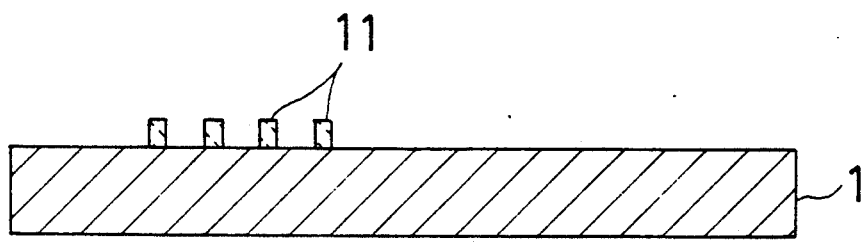
Figure 27:
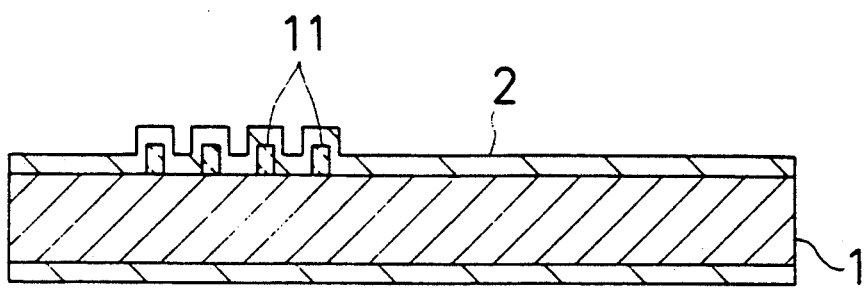

As seen from FIG. 25, an alignment light transmission film 9C, made from a 0.1 μm thick SiO$_2$ film, is first formed on the surface of the base 1 of a Si substrate. Then a photolithographic process is applied onto the alignment light transmission film 9C to form the alignment light transmission grating pattern 11 made from the alignment light transmission film 9C, on the surface of the base 1 (FIG. 26). Next, as shown in FIG. 27, the X-ray transmission film 2 of a SiN film in a cross-sectionally uneven form is formed all over the surfaces of the base 1 and the alignment light transmission film 9C, as shown in FIG. 27.

Figure 28:
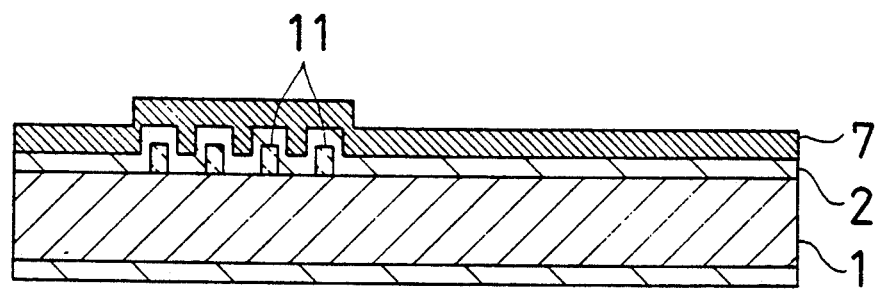
Figure 29:
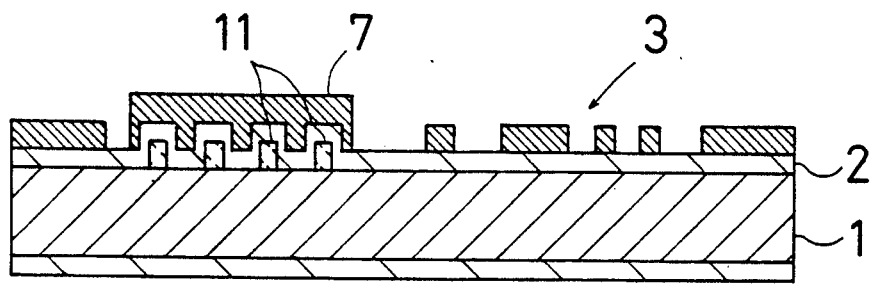

As shown in FIG. 28, the metal film 7, which is a 0.8 μm thick tungsten film and serves not only as an alignment light reflection film but also as an X-ray absorber, is formed on the entire surface of the X-ray transmission film 2. Then a photolithographic process is applied to the metal film 7 so that the metal film 7 is left only on the surface of the alignment light transmission grating pattern 11 (see FIG. 29). In accordance with this embodiment, the metal film 7 formed on the surface of the alignment light transmission grating pattern 11, and the LSI pattern 3 is formed at the same time thorough the photolithographic process applied to the metal film 7.

Figure 30:
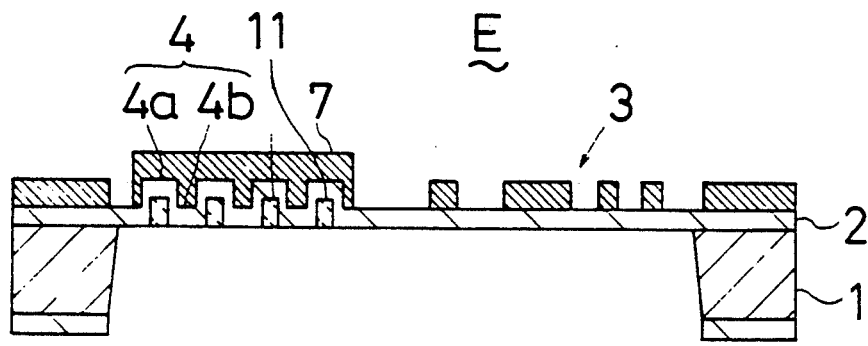

Further, as shown in FIG. 30, an etching is applied to the back of the base 1 corresponding to an exposure region for X-rays transmission to form it (the base 1) into a frame form. The convex portion 4a composed the projecting portion of the X-ray transmission film 2 and the alignment light transmission grating pattern 11, and the concave portion 4b composed of only the X-ray transmission film 2 together make up the alignment mark 4 in a grating form. The level difference between the diffraction gratings of the alignment mark 4 is subject to the thickness of the SiO$_2$ alignment light transmission film 9C (see FIG. 25). Thus, by setting the thickness of the alignment light transmission film 9C to a desired value, the level difference can be set to a desired value to optimize the efficiency of diffraction.

The X-ray transmission film 2 may be made of a Si film, a SiC film or a thin diamond film, although a SiN film is used in the foregoing embodiments. As for the alignment light reflection grating pattern 5 of the alignment mark 4, and the X-ray absorber formed as the metal film 7, a thin film of heavy metals (such as Au and Ta) may be employed instead of using a tungsten film.

Figure 31:
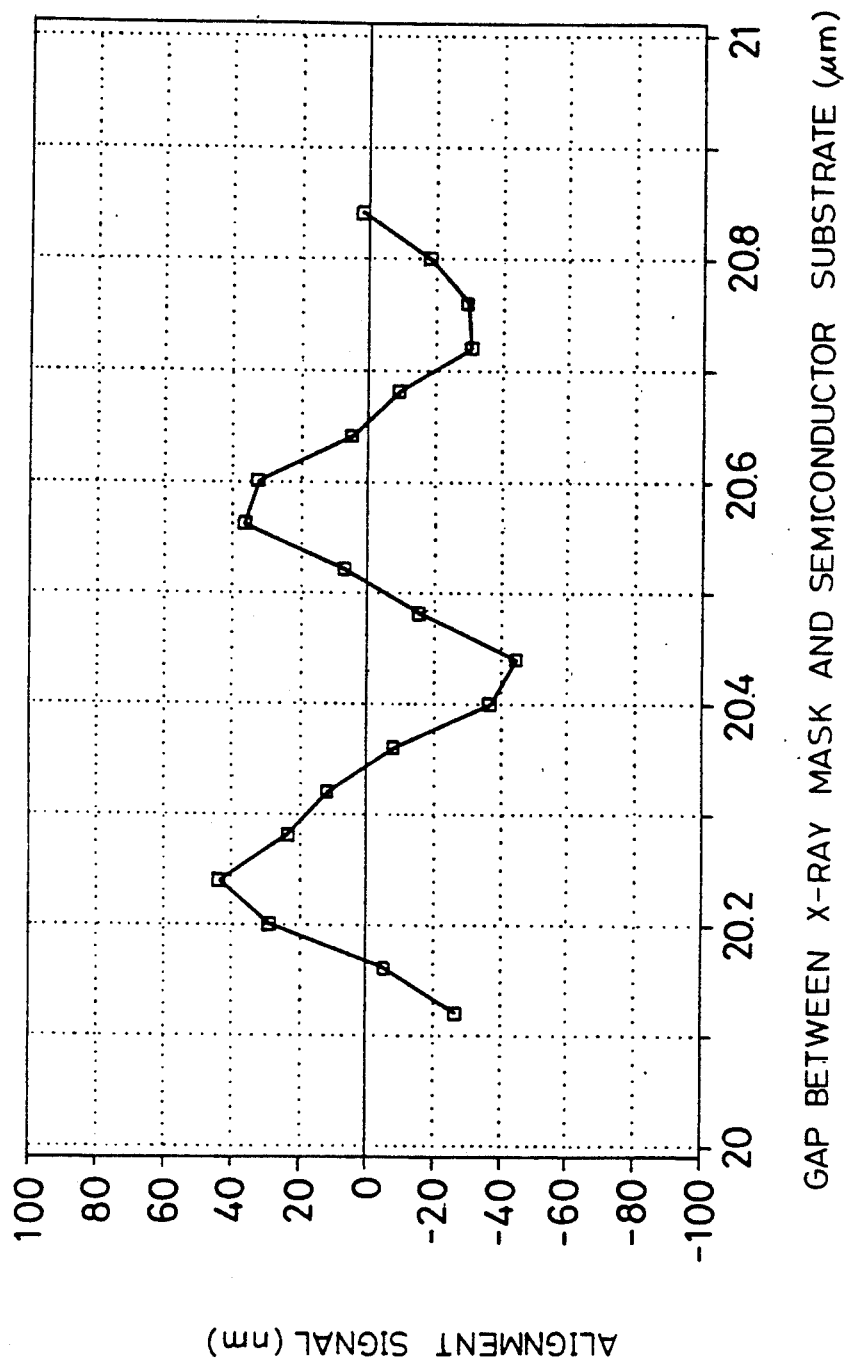
FIG. 31 shows alignment signal errors for a conventional X-ray mask.

FIG. 31 shows how the alignment signal varies with changes in gap between the conventional X-ray mask G and the semiconductor substrate 30. The abscissa indicates the gap between the X-ray mask and the semiconductor substrate, and the ordinate the alignment signal. The change of the alignment signal is measured as follows. With the gap between the X-ray mask G and the semiconductor substrate 30 set at a determined value, the resulting alignment signals are recorded. Then without changing the planar relative position between the X-ray mask G and the semiconductor substrate 30 but with changing the gap between the X-ray mask G and the semiconductor substrate 30 at 40 nm-step intervals, the resulting alignment signals are recorded.

As the planar relative position between the X-ray mask G and the semiconductor substrate 30 stays unchanged, the alignment signal should not change even if the gap between the mask G and the substrate 30 changes. However, for the convention X-ray mask G, the signal variation of about ±40 nm is measured. Such a value appears exactly as an alignment error, which has effects on the alignment.

Figure 32:
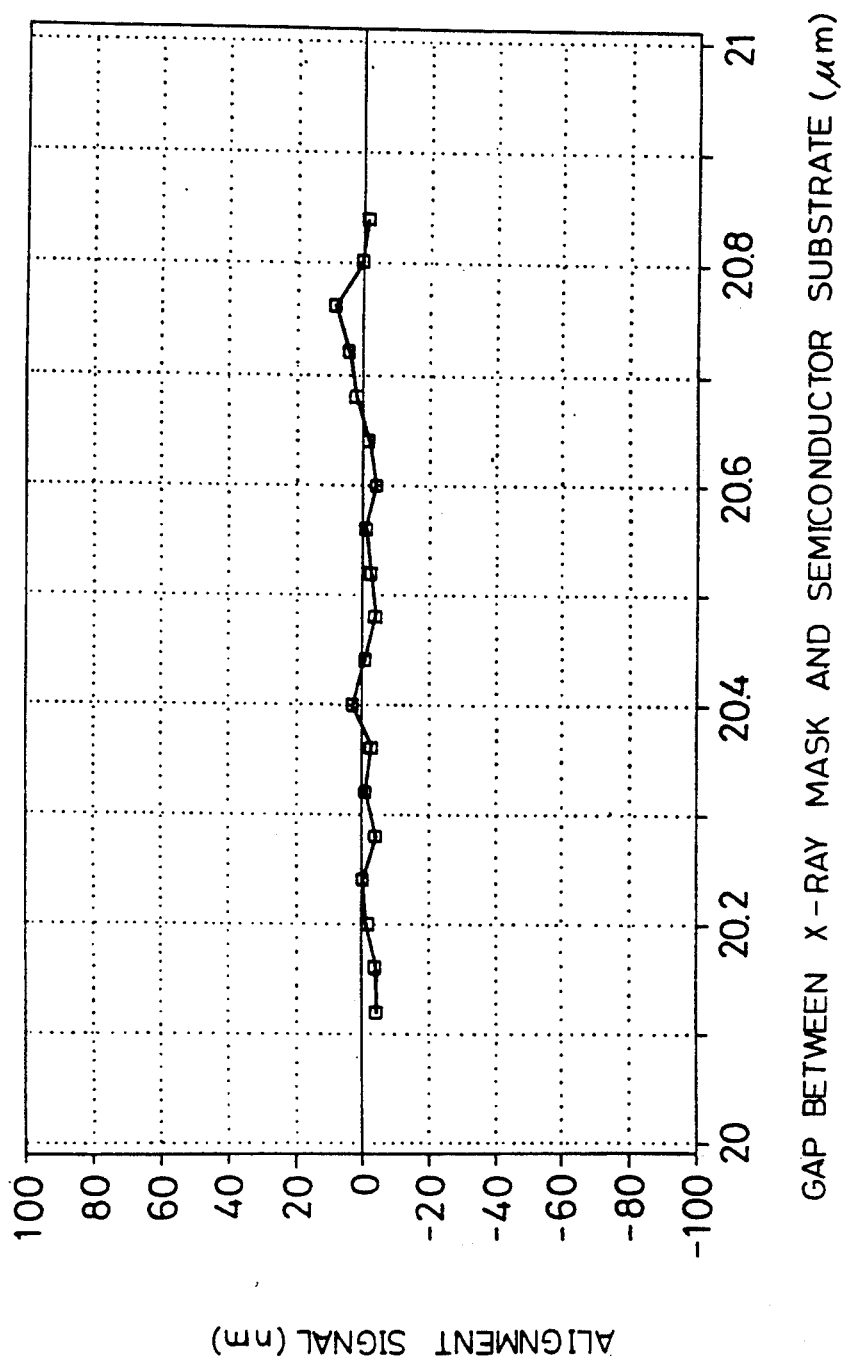
FIG. 32 shows alignment signal errors for the X-ray mask of the second embodiment of the present invention.

FIG. 32 shows how the alignment signal varies with changes in gap between the X-ray mask B of the second embodiment of the invention and the semiconductor substrate, under the same measurement method as the above. The abscissa indicates the alignment signal, and the ordinate the gap between the X-ray mask and the semiconductor substrate. As clearly seen from FIG. 32, the variation of the alignment signal can be held at ±5 nm, which confirms the effects of the present invention.

What is claimed is:

1. An X-ray mask having an X-ray transmission film formed on the surface of a mask base, and an alignment mark formed on the surface of said X-ray transmission film wherein:
   (a) the surface of said X-ray transmission film is formed alternately into a grating form as well as into a cross-sectionally uneven form to form said alignment mark having a convex portion and a concave portion,
   (b) the convex portion of said alignment mark has on a surface thereof a first alignment light reflection film for reflecting an alignment light passing through said X-ray transmission film,
   (c) the concave portion of said alignment mark has on a surface thereof a second alignment light reflection film for reflecting the alignment light passing through said X-ray transmission film, and
   (d) said first alignment light reflection film and said second alignment light reflection film are formed in respective different processes.

2. The X-ray mask of claim 1, wherein:
   (a) the concave portion of said alignment mark is formed by recessing the surface of said X-ray transmission film into a grating form, and
   (b) the convex portion of said alignment mark is made up of a flat region defined between the concave portions of the surface of said X-ray transmission film.

3. The X-ray mask of claim 1, wherein said first alignment light reflection film is an X-ray absorber.

4. The X-ray mask of claim 1, wherein said first alignment light reflection film and said second alignment light reflection film are made of the same material.

5. The X-ray mask of claim 1, wherein said first alignment light reflection film and said second alignment light reflection film are respectively made of different materials.

6. An X-ray mask having an X-ray transmission film formed on the surface of a mask base, and an alignment mark formed on the surface of said X-ray transmission film wherein:
   (a) an alignment light reflection grating pattern in a grating form which is made of a first alignment light reflection film
   for reflecting the alignment light passing through said X-ray transmission film is formed on the surface of said X-ray transmission film,
   (b) an alignment light transmission film in a grating form is formed on the other surface region of said X-ray transmission film without having thereon said alignment light reflection grating pattern,
   (c) a second alignment light reflection film for reflecting the alignment light passing through said X-ray transmission film is formed on the surface of said alignment light transmission film, and
   (d) said first alignment light reflection film and said second alignment light reflection film are formed in respective different processes, and
   (e) said alignment mark is made up of a convex portion composed of said X-ray transmission film and said alignment light transmission film, and a concave portion composed of a surface region of said X-ray transmission film corresponding to the back of said alignment light reflection grating pattern.

7. The X-ray mask of claim 4, wherein said first alignment light reflection film is an X-ray absorber.

8. The X-ray mask of claim 6, wherein said first alignment light reflection film and said second alignment light reflection film are made of the same material.

9. The X-ray mask of claim 6, wherein said first alignment light reflection film and said second alignment light reflection film are respectively made of different materials.

10. A method of producing an X-ray mask comprising the steps of:
    (a) forming an X-ray transmission film on the surface of a mask base,
    (b) forming an alignment light reflection grating pattern, which is made up of a first alignment light reflection film for reflecting the alignment light passing through said X-ray transmission film in a grating form, on the surface of said X-ray transmission film,
    (c) forming, by the application of an etching to said X-ray transmission film wherein said alignment light reflection grating pattern is used as a resist mask, an alignment mark composed of a concave portion in a grating form that is a recess formed on said X-ray transmission film, and a convex portion made up of a flat region defined between the concave portions, on the surface of said X-ray transmission film, and
    (d) forming a second alignment light reflection film for reflecting the alignment light passing through said X-ray transmission film on the surface of said alignment mark.

11. A method of producing an X-ray mask comprising the steps of:
(a) forming an X-ray transmission film on the surface of a mask base,
(b) forming an alignment light reflection grating pattern, which is made up of a first alignment light reflection film for reflecting the alignment light passing through said X-ray transmission film in a grating form, on the surface of said X-ray transmission film,
(c) forming, by forming an alignment light transmission film in a grating form on a region of the surface of said X-ray transmission film without having thereon said alignment light reflection grating pattern, an alignment mark composed of a convex portion made up of said X-ray transmission film and said alignment light transmission film, and a concave portion composed of a surface region of said X-ray transmission film corresponding to the back of said alignment light reflection grating pattern, and
(d) forming a second alignment reflection film for reflecting the alignment light passing through said X-ray transmission film, on the surface of said alignment light transmission film.

* * * * *